(12) United States Patent
Chen et al.

(10) Patent No.: US 8,069,908 B2
(45) Date of Patent: Dec. 6, 2011

(54) HEAT DISSIPATION DEVICE HAVING A FAN HOLDER

(75) Inventors: Chun-Chi Chen, Taipei Hsien (TW); Hong-Cheng Yang, Shenzhen (CN); He-Ping Liu, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 1012 days.

(21) Appl. No.: 11/964,899

(22) Filed: Dec. 27, 2007

(65) Prior Publication Data

US 2009/0166010 A1    Jul. 2, 2009

(51) Int. Cl.
*F28F 7/00* (2006.01)
*F24H 3/02* (2006.01)
*H01L 23/467* (2006.01)
*H05K 7/20* (2006.01)

(52) U.S. Cl. ........ 165/80.3; 165/121; 165/185; 361/697

(58) Field of Classification Search ................. 165/80.3, 165/121, 185; 631/697; 361/697
See application file for complete search history.

(56) References Cited

U.S. PATENT DOCUMENTS

| | | | |
|---|---|---|---|
| 6,520,250 B2 * | 2/2003 | Lee et al. | 165/121 |
| 6,736,196 B2 * | 5/2004 | Lai et al. | 165/122 |
| 6,940,716 B1 * | 9/2005 | Korinsky et al. | 361/695 |
| 7,178,587 B2 * | 2/2007 | Liu | 165/185 |
| 7,359,192 B2 * | 4/2008 | Yang et al. | 361/695 |
| 2007/0035926 A1 * | 2/2007 | Xia et al. | 361/695 |
| 2007/0274038 A1 * | 11/2007 | Sun | 361/695 |
| 2009/0159245 A1 * | 6/2009 | Chen et al. | 165/121 |

* cited by examiner

*Primary Examiner* — Judy Swann
*Assistant Examiner* — Indrajit Ghosh
(74) *Attorney, Agent, or Firm* — Altis Law Group, Inc.

(57) ABSTRACT

An exemplary heat dissipation device includes a heat sink, a fan holder, and a fan secured on a front side of the fan holder. The heat sink includes a base having two first fixing ears at its two lateral sides, and fins on the base. An engaging notch is defined in a top end of four of the fins. The fan holder includes a top panel, and two sidewalls extending downwardly from two lateral edges of the top panel. The top panel has a pair of inserting protrusions at a bottom surface thereof. The two sidewalls have two fixing flanges at lower ends thereof. The top panel is partially placed on the front portion of the top ends of the fins, and the inserting protrusions are inserted into the engaging notches of the fins. The two sidewalls abut against two lateral sides of the heat sink, and the two fixing flanges are disposed on the two first fixing ears.

17 Claims, 5 Drawing Sheets

HEAT DISSIPATION DEVICE HAVING A FAN HOLDER

BACKGROUND OF THE INVENTION

1. Field of the Invention

The present invention relates generally to a heat dissipation device, and more particularly to a heat dissipation device having a heat sink and a fan holder for facilitating a mount of a fan on the heat sink, wherein the fan holder also functions as a fan duct to guide an airflow flowing from the fan to electronic devices.

2. Related Art

Generally, in order to ensure the normal running of an electronic device, a heat dissipation device is used to dissipate heat generated by the electronic device. A conventional heat dissipation device includes a heat sink and a fan attached on the heat sink to improve a heat-dissipation capacity of the heat sink.

When installing the fan to the heat sink, in general, the fan is fixed to a side of the heat sink via a fan holder with screws. Although using the screws can achieve the fastening objective, it requires a lot of manpower and material resources. Furthermore, it is necessary to remove the fan first by unscrewing the screws when disassembling and maintaining the heat dissipation device. Such unscrewing operation is tiresome for a user. In addition, it is also possible that the unscrewed screws may fall into a computer in which the heat dissipation device is mounted and cause damage to components of the computer.

What is needed, therefore, is a heat dissipation device having a design which makes assembling and disassembling of a fan to/from a heat sink of the heat dissipation device convenient and easy.

SUMMARY OF THE INVENTION

The present invention relates to a heat dissipation device for dissipating heat from a heat-generating electronic element. The heat dissipation device includes a heat sink, a fan holder and a fan secured on a front side of the fan holder. The heat sink comprises a base and a plurality of fins on the base. At least an engaging notch is defined in top ends of the fins. The base has two first fixing ears extending laterally from two lateral sides thereof. The fan holder comprises a top panel and two sidewalls extending downwardly from two lateral edges of the top panel. The top panel has at least an inserting protrusion at a bottom surface thereof. The two sidewalls have two fixing flanges extending laterally from lower ends thereof. The top panel is partially placed on a front portion of the top ends of the fins, and the at least an inserting protrusion is inserted into the at least an engaging notch of the fins. The two sidewalls abut against two lateral sides of the heat sink, and the two fixing flanges are respectively disposed on the two first fixing ears of the base of the heat sink. The fan is easily assembled to the heat sink via the fan holder, because neither the installation of the fan to the fan holder nor the installation of the fan holder to the heat sink requires any additional screws or a related tool, and can simply be completed by operations of proper placement and pushing via the locking structures which are provided by the fan holder.

Other advantages and novel features will become more apparent from the following detailed description of preferred embodiments when taken in conjunction with the accompanying drawings, in which:

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiment. Moreover, in the drawings, like reference numerals designate corresponding parts throughout the several views.

DETAILED DESCRIPTION OF THE INVENTION

Figure 1:
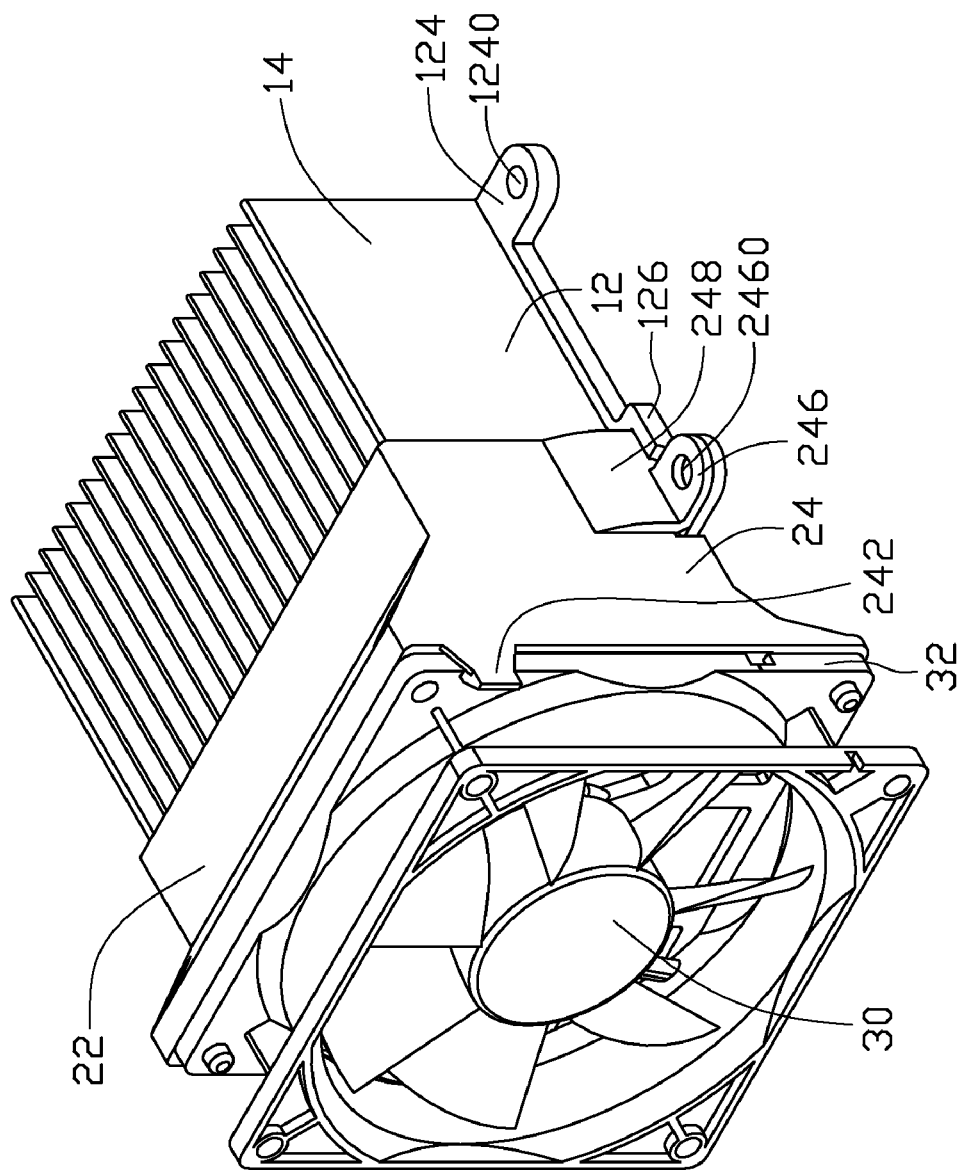
FIG. 1 is an assembled view of a heat dissipation device in accordance with a preferred embodiment of the present invention.
Figure 2:
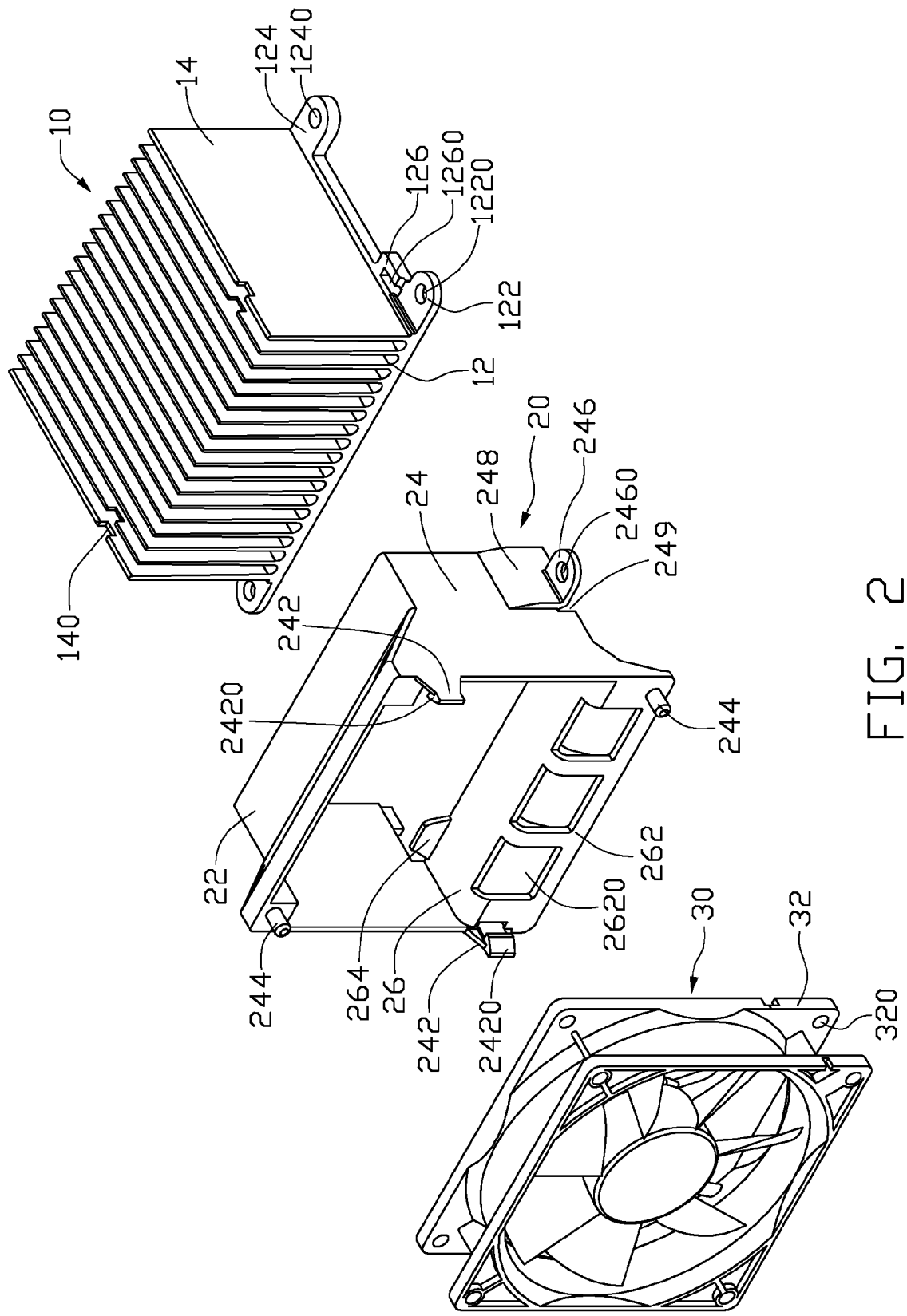
FIG. 2 is an exploded, isometric view of FIG. 1.

FIGS. 1 to 5 illustrate a heat dissipation device in accordance with a preferred embodiment of the present invention. The heat dissipation device is adapted for removing heat from a heat-generating component such as CPU (not shown) mounted on a printed circuit board (not shown). The heat dissipation device comprises a heat sink 10, a fan holder 20 and a fan 30 mounted on a front side of the heat sink 10 via the fan holder 20, wherein the fan holder 20 is located between the heat sink 10 and the fan 30.

The heat sink 10 is formed of a material having good heat conductivity such as aluminum and copper. The heat sink 10 comprises a heat receiver such as a rectangular base 12 and a plurality of fins 14 extending upwardly from a top surface of the base 12. As particularly shown in FIGS. 4 and 5, the base 12 has a protruding portion 120 extending downwardly from a middle of a bottom surface thereof, for contacting the CPU. A front end of the protruding portion 120 is triangular, with a tip thereof pointing to the fan 30 for guiding an airflow generated by the fan 30 to electronic components (not shown) located at two lateral sides of the CPU. The base 12 has two first fixing ears 122 and two second fixing ears 124 extending laterally from two opposite lateral sides thereof. The two first fixing ears 122 and two second fixing ears 124 are respectively located adjacent to four corners of the base 12, and respectively define two first retaining holes 1220 and two second retaining holes 1240 therein for receiving a fixture to secure the heat sink 10 onto the CPU. The two first fixing ears 122 adjoin a front side of the base 12, and have a thickness approximately equal to half the thickness of the base 12. Two locking parts 126 extend laterally from the two opposite lateral sides of the base 12. The locking parts 126 adjoin the first fixing ears 122, respectively, and define two locking slots 1260 therein, respectively. The fins 14 are substantially rectangular thin plates spaced from each other and are perpendicular to the top surface and a front side of the base 12. Top ends of the fins 14 are coplanar. The top ends of a pair of the fins 14 near each of two opposite lateral sides of the heat sink 10 define two engaging notches 140 therein, respectively. The engaging notches 140 are in alignment with each other and situated close to the front side of fins 14.

The fan holder 20 can be integrally formed of plastic and comprises a top panel 22, two sidewalls 24 extending downwardly from two lateral edges of the top panel 22 and a bottom board 26 connecting front parts of bottom edges of the sidewalls 24. Fronts sides of the top panel 22, sidewalls 24 and the bottom board 26 are coplanar and cooperatively define a fixing interface (not labeled) for mounting the fan 30 thereon. A front portion of the top panel 22 is oblique upwardly to reach an upper edge of the fan 30. The top panel 22 has two spaced inserting protrusions 220 (shown in FIG. 5) extending downwardly from a bottom surface thereof and joining to the two sidewalls 24. The inserting protrusions 220 are situated adjoining to a rear edge of the top panel 22 and configured to be insert into the engaging notches 140 of the heat sink 10 for positioning the fan holder 20 to the heat sink 10. The two sidewalls 24 are perpendicular to the top panel 22 and cover front parts of the two lateral sides of the heat sink 10. A right one of the sidewalls 24 has a latching arm 242 extending forward from the upper front side thereof and adjacent to the top panel 22. A left one of the sidewalls 24 also has a latching arm 242 extending forward from the lower front side thereof and adjacent to the bottom board 26. The two latching arms 242 are substantially catercornered on the fixing interface of the fan holder 20 and have two hooks 2420 formed respectively at two distal ends thereof. The two hooks 2420 of the two latching arms 242 face inwardly and are configured to diagonally catch two lateral sides of the fan 30. A pair of restricting posts 244 extend forward from other two catercornered positions of the mounting interface of the fan holder 20 for being inserted into the fan 30 to hold the fan 30 in position.

The two sidewalls 24 have two protruding parts 248 at two corners thereof that are adjacent to lower ends and rear sides thereof. The two protruding parts 248 protrude laterally and are thicker than other part of the sidewalls 24. Two fixing flanges 246 extend horizontally and laterally from bottom edges of front portions of the two protruding parts 248, and have configurations consistent with those of the first fixing ears 122 of the heat sink 10. Either of the fixing flanges 246 therein defines an extending hole 2460, which communicates with the retaining hole 1220 of the corresponding first fixing ear 122 of the heat sink 10 when the fixing flange 246 is disposed on the first fixing ear 122 for receiving the fixture. A sum of the thicknesses of the fixing flange 246 and the first fixing ear 122 is equal to that of the base 12 of the heat sink 10. Bottom edges of rear portions of the protruding parts 248 are in a lower level than bottom surfaces of the fixing flanges 246 to form a thrusting portion 2480 inserted into the locking slots 1260 of the locking parts 126 of the heat sink 10 to hold the fan holder 20 in position. As the thrusting portions 2480 of the protruding parts 248 extend downwardly beyond the fixing flanges 246, two gaps 249 are defined under the two fixing flanges 246 for receiving the two first fixing ears 122 therein.

Figure 3:
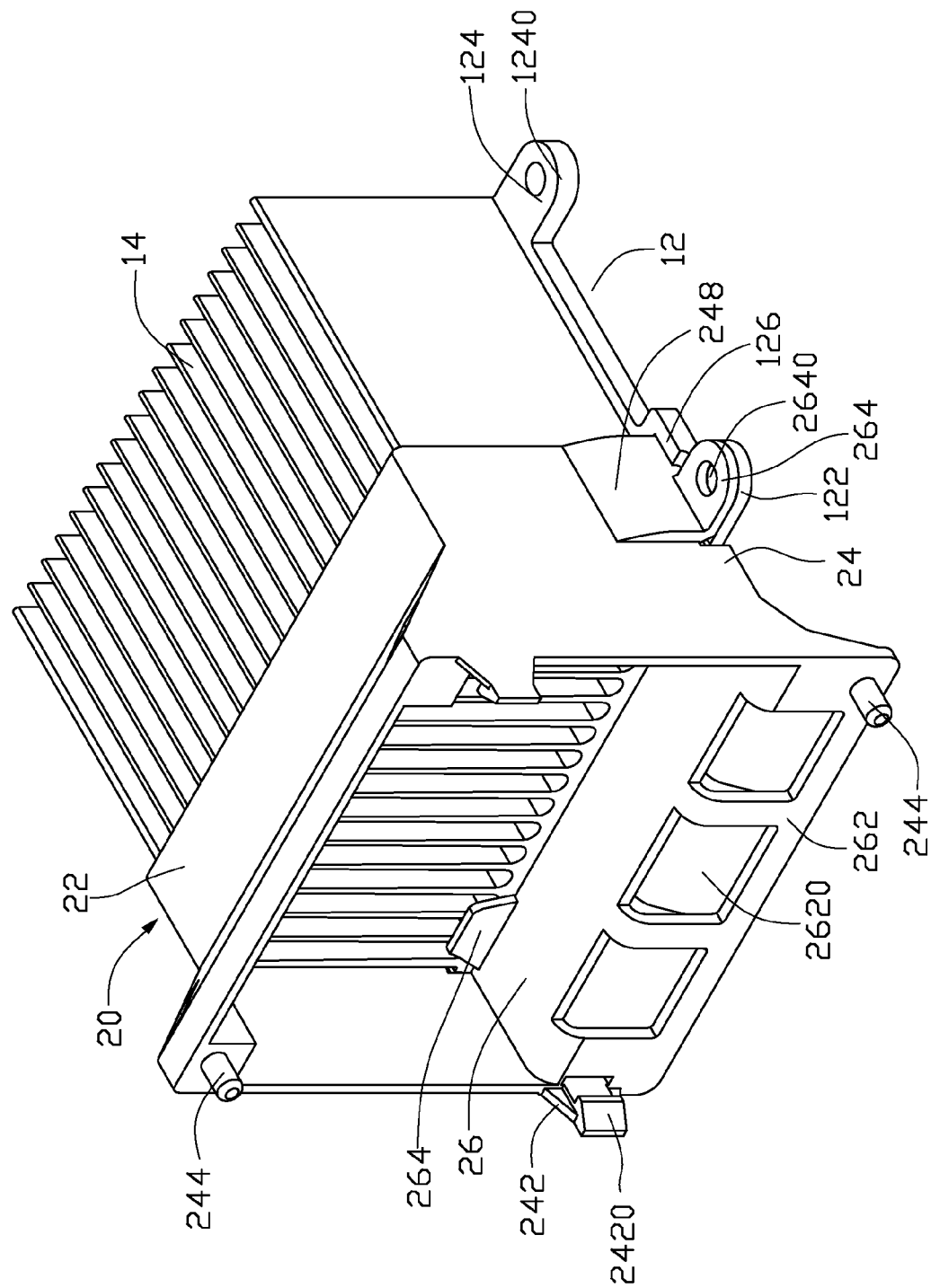
FIG. 3 is an assemble view of a heat sink and a fan holder of the heat dissipation device in FIG. 2.
Figure 4:
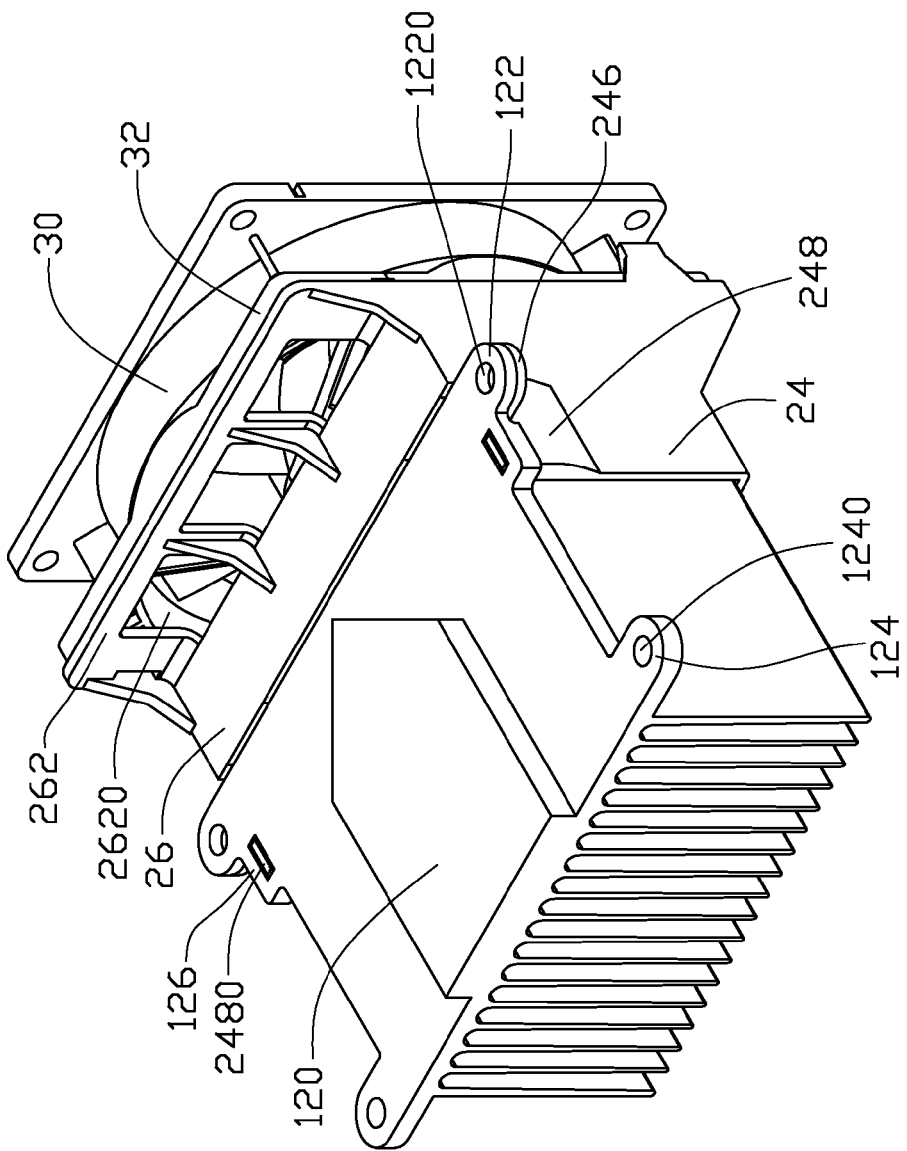
FIG. 4 is an inverted view of the heat dissipation device in FIG. 1.
Figure 5:
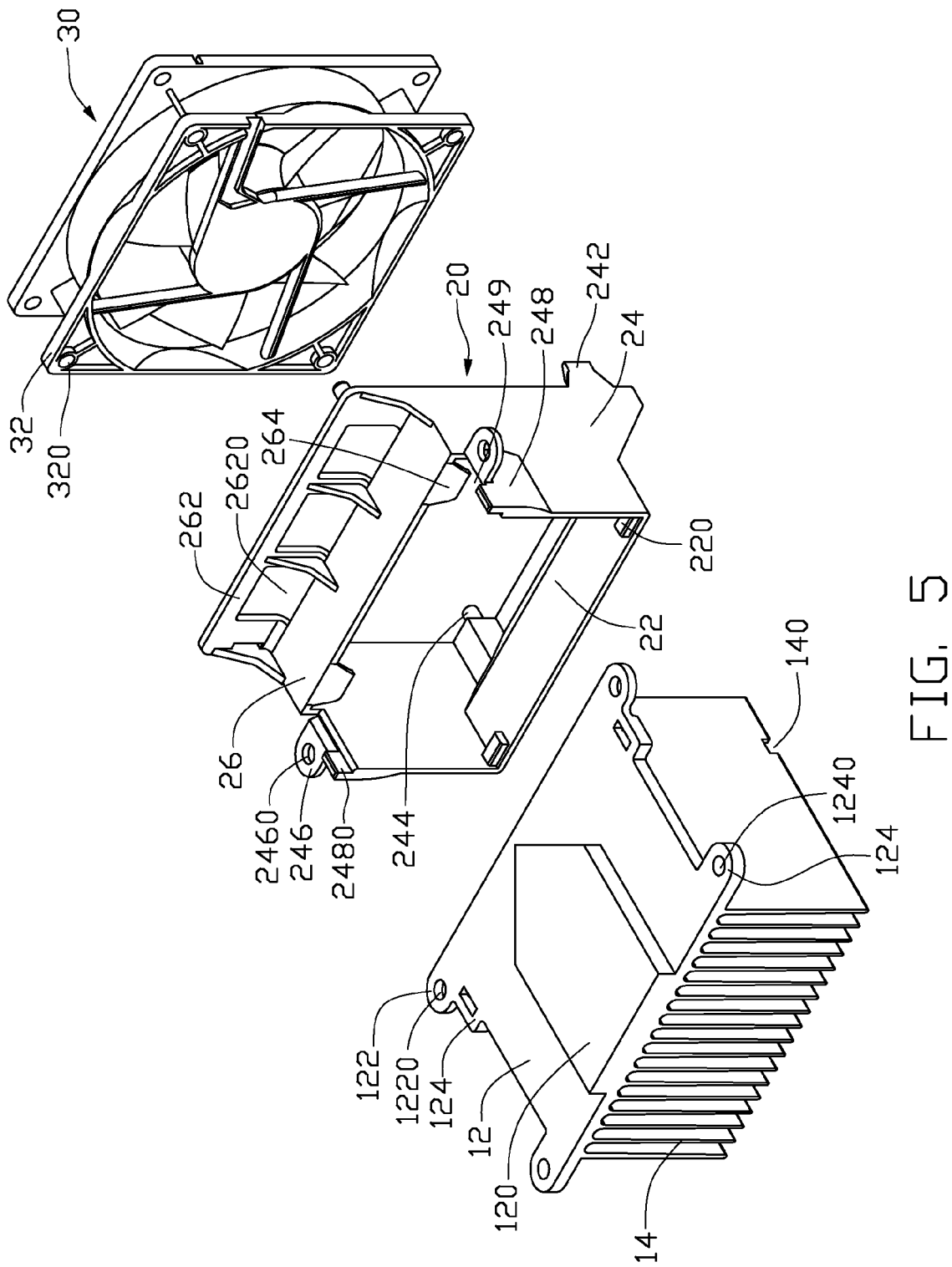
FIG. 5 is an exploded, isometric view of FIG. 4.

The bottom board 26 is parallel to the top panel 22, and located closely in front of the gaps 249. The bottom board 26 has an air-guiding plate 262 extending downwardly from a front side thereof. The air-guiding plate 262 faces the fan 30 and defines a plurality of through holes 2620 therein. The through holes 2620 are located beneath the base 12 of the heat sink 10, whereby airflow blowing from the fan 30 can pass through the through holes 2620 to reach the triangular front end of the protruding portion 120 of the base 12. A plurality of tabs 264 projects upwardly from a rear edge of the bottom board 26 and abuts against the front side of the base 12 of the heat sink 10 to keep the fan holder 20 in position (as shown in FIG. 3).

The fan 30 has a rectangular frame (not labeled) having a size consistent with that of the fixing interface of the fan holder 20. The frame has two separated fixing flanges 32 at each corner thereof. Each of the flanges 32 defines a fixing hole 320 therein for providing an insertion of the restricting post 244 of the fan holder 20.

In assembly of the heat dissipation device, the inserting protrusions 220 of the top panel 22 of the fan holder 20 are inserted into the engaging notches 140 in a top of the heat sink 10. The tabs 264 abut against the front side of the base 12 of the heat sink 10. The two sidewalls 24 of the fan holder 20 abut against the front part of the two lateral sides of the heat sink 10. The fixing flanges 246 are disposed on the two first fixing ears 122 of the heat sink 10, and the thrusting portions 2480 of the protruding parts 248 are inserted into the locking slots 1260 of the locking parts 126 of the heat sink 10. Thus the fan holder 20 is pre-assembled to the front side of the heat sink 10, and will be simultaneously securely locked when the fixtures extend through the communicating extending holes 2460 of the fixing flanges 246 and the retaining holes 1220 of the first fixing ears 122, and the retaining holes 1240 of the second fixing ears 124, to mount the heat dissipation device onto the printed circuit board. The restricting posts 244 are inserted in two fixing holes 320 of two diagonal fixing flanges 32 of the fan 20, and the two hooks 2420 of the latching arms 242 of the fan holder 20 are fastened to another two diagonal fixing flanges 32 of the fan 30. Thus the fan 30 is securely assembled to the fan holder 20.

According to aforementioned description, the fan 30 is easily assembled to the heat sink 10 via the fan holder 20, because either installation of the fan 30 to the fan holder 20 or the fan holder 20 to the heat sink 10 do not require any additional screws and tools, and can be simply completed by operations of proper placement and pushing via a locking structure which is provided by the fan holder 20. The fan holder 20 is further secured by the fixture to mount the heat dissipation device onto the printed circuit board, and does not need specified screws for itself. The fan holder 20 also works as a fan duct and encloses space between the fan 30 and the heat sink 10 to force as more as possible of the airflow generated by the fan 30 to pass through the heat sink 10.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device adapted for dissipating heat from a heat-generating electronic element, the heat dissipation device comprising:

a heat sink comprising a base and a plurality of fins extending upwardly from the base, at least an engaging notch being defined in a top of the fins, the base having two first fixing ears and two second fixing ears respectively located adjacent to four corners of the base, the two first fixing ears located adjacent to a front side of the base, the two second fixing ears located adjacent to a rear side of the base, each of the two first fixing ears and the two second fixing ears defining a retaining hole therein for receiving a fixture;

a fan holder coupled to the front side of the base, the fan holder comprising a top panel and two sidewalls extending downwardly from two lateral edges of the top panel, the top panel having at least an inserting protrusion extending downwardly from a bottom surface thereof, the two sidewalls having two fixing flanges extending laterally from lower ends thereof corresponding to the two first fixing ears of the base, each of the fixing flanges defining an extending hole therein corresponding to the retaining hole of a respective first fixing ear, and each of the second fixing ears having a thickness substantially equal to a sum of the thicknesses of one of the fixing flanges and the respective first fixing ear, the sidewalls being perpendicular to the top panel, the fan holder further comprising a bottom board connecting to front portions of the lower ends of the sidewalls, the bottom board being parallel to the top panel and having an air-guiding plate extending downwardly from a front side thereof, the air-guiding plate therein defining a plurality of through holes located beneath the base of the heat sink; and a fan secured at a front side of the fan holder;

wherein the top panel is partially placed on a front portion of the top ends of the fins and the at least an inserting protrusion is inserted into the at least an engaging notch of the fins, the two sidewalls abut against front portions of two lateral sides of the heat sink and the two fixing flanges are respectively disposed on the two first fixing ears of the base of the heat sink, and the retaining hole of each first fixing ear and the extending hole of the corresponding fixing flange communicate with each other for receiving the fixture therein to fix the fan holder on the heat sink and at the same time to fix the base of the heat sink on the heat generating electronic element.

2. The heat dissipation device of claim 1, wherein the two sidewalls have two protruding parts at two corners thereof that are adjacent to lower ends and rear sides thereof, the two fixing flanges extend horizontally and outwardly from lower edges of the two protruding parts, and two openings are defined under the two fixing flanges and accommodate the two first fixing ears of the heat sink.

3. The heat dissipation device of claim 2, wherein the base has two locking parts projecting laterally from two lateral sides of the base, the two locking parts adjoin the two first fixing ears, respectively, each of the locking parts defines a locking slot having an opening facing a corresponding fixing ear, and bottom edges of rear portions of the two protruding parts are inserted into the two locking slots of the two locking parts.

4. The heat dissipation device of claim 3, wherein bottom edges of rear portions of the two protruding parts are in a lower level than bottom surfaces of the fixing flanges to form a thrusting portion inserted into the locking slots of the locking parts of the heat sink to hold the fan holder in position.

5. The heat dissipation device of claim 1, wherein a front portion of the top panel is oriented oblique upwardly, and the at least an inserting protrusion is adjacent to a rear side of the top panel.

6. The heat dissipation device of claim 1, wherein the base has a protruding portion extending downwardly from a middle of a bottom surface thereof, and a front end of the protruding portion is triangular with a tip thereof pointing to the through holes.

7. The heat dissipation device of claim 1, wherein a restricting post extends forward from a joint between a right one of the sidewalls and the top panel, and another restricting post extends forward from a joint between a left one of the sidewalls and the bottom board.

8. The heat dissipation device of claim 7, wherein a latching arm extends forward from a front side of the right one of the sidewalls and is adjacent to the top panel, and another latching arm extends forward from a front side of the left one of the sidewalls and is adjacent to the bottom board.

9. The heat dissipation device of claim 8, wherein two hooks respectively extend inwardly from distal ends of the latching arms and catch two lateral sides of the fan, and the two restricting posts are inserted into two diagonal corners of the fan.

10. The heat dissipation device of claim 1, wherein the fins are spaced from each other and are perpendicular to a top surface and a front side of the base.

11. A heat dissipation device, comprising:
a heat sink comprising a base and a plurality of fins extending upwardly from the base, the base having a pair of first fixing ears at two opposite lateral sides thereof, at least one engaging notch being defined in a top of the fins;

a fan holder coupled to the front side of the base, the fan holder comprising a top panel, two sidewalls extending downwardly from two lateral ends of the top panel, and a bottom panel opposite to the top panel and extending from bottom ends of the sidewalls; the top panel, the sidewalls and the bottom panel cooperatively forming a mounting interface at a front side of the fan holder, a locking device formed at the mounting interface, the top panel forming at least a protrusion engaged in the at least one engaging notch of the fins of the heat sink, the sidewalls at a lower portion thereof having two fixing flanges respectively placed on the two first fixing ears;

a fan mounted on the mounting interface of the fan holder via the locking device; and a plurality of tabs extending upwardly from an end of the bottom panel and abutting against the base of the heat sink, and a plurality of through holes defined in the bottom panel and toward the fan.

12. The heat dissipation device of claim 11, wherein the locking device comprises a pair of restricting posts formed at two diagonal corners of the mounting interface of the fan holder, and a pair of latching arms formed at the other two diagonal corners of the mounting interface of the fan holder, the restricting posts are snugly engaged in corresponding corners of the fan, and the latching arms snugly grasp corresponding corners of the fan.

13. The heat dissipation device of claim 11, wherein the top panel, the sidewalls and the bottom panel cooperatively define an opening toward the fins for providing passage to an airflow generated by the fan.

14. The heat dissipation device of claim 11, wherein a bottom of the bottom panel is located below the base in a manner such that a bottom of the fan is located below a bottom of the base of the heat sink.

15. A heat dissipation device adapted for dissipating heat from a heat-generating electronic element, the heat dissipation device comprising:
a heat sink comprising a base and a plurality of fins extending upwardly from the base, at least an engaging notch being defined in a top of the fins, the base having two first fixing ears extending laterally from two lateral sides thereof;

a fan holder coupled to a front side of the heat sink, the fan holder comprising a top panel, two sidewalls extending downwardly from two lateral edges of the top panel, and a bottom board, the top panel having at least an inserting protrusion extending downwardly from a bottom surface thereof, the two sidewalls being perpendicular to the top panel and having two fixing flanges extending laterally from lower ends thereof, the bottom board being parallel to the top panel and connecting to front portions of the lower ends of the sidewalls, the bottom board having an air-guiding plate extending downwardly from a front side thereof; and a fan secured at a front side of the fan holder;

wherein the top panel is partially placed on a front portion of the top ends of the fins and the at least an inserting protrusion is inserted into the at least an engaging notch of the fins, the two sidewalls abut against front portions of two lateral sides of the heat sink, and the two fixing flanges are respectively disposed on the two first fixing ears of the base of the heat sink; and wherein the air-guiding plate therein defines a plurality of through holes that are located beneath the base of the heat sink.

16. The heat dissipation device of claim 15, wherein the base has a protruding portion extending downwardly from a middle of a bottom surface thereof, and a front end of the protruding portion is triangular with a tip thereof pointing to the through holes.

17. The heat dissipation device of claim 15, wherein a restricting post extends forward from a joint between a right one of the sidewalls and the top panel, another restricting post extends forward from a joint between a left one of the sidewalls and the bottom board, a latching arm extends forward from a front side of the right one of the sidewalls and is adjacent to the top panel, another latching arm extends forward from a front side of the left one of the sidewalls and is adjacent to the bottom board, the two restricting posts are inserted into two diagonal corners of the fan, and two hooks respectively extend inwardly from distal ends of the latching arms and catch two lateral sides of the fan.

* * * * *